United States Patent [19]
Jacomb-Hood

[11] Patent Number: 4,771,247
[45] Date of Patent: Sep. 13, 1988

[54] MMIC (MONOLITHIC MICROWAVE INTEGRATED CIRCUIT) LOW NOISE AMPLIFIER

[75] Inventor: Anthony W. Jacomb-Hood, Liverpool, N.Y.

[73] Assignee: General Electric Company, Syracuse, N.Y.

[21] Appl. No.: 100,416

[22] Filed: Sep. 24, 1987

[51] Int. Cl.[4] .............................................. H03F 3/193
[52] U.S. Cl. .................................... 330/277; 330/286; 330/307
[58] Field of Search ................ 330/277, 286, 306, 307

[56] References Cited

U.S. PATENT DOCUMENTS 4,614,915  9/1986  Heston et al. ........................ 330/277

OTHER PUBLICATIONS

Tajima et al, "X, Ku-Band GaAs Monolithic Amplifier", 1982, *IEEE MTT-S Digest*, pp. 476-478.

MMIC: On-Chip Tunability, R. Goyal and S. S. Bharj Microwave Journal, Apr. 1987, (pp. 135, 138 and 139).

*Primary Examiner*—James B. Mullins
*Attorney, Agent, or Firm*—Richard V. Lang; Carl W. Baker; Fred Jacob

[57] ABSTRACT

The invention relates to a low noise amplifier for use at microwave frequencies which may be fabricated using integrated circuit techniques. In accordance with the invention, critical components are made adjustable so as to simplify the design process and manufacturability of the amplifier. A two stage low noise amplifier is disclosed in which TEE networks are used as input and output networks in each stage, and in which one element of each TEE includes an adjustable spiral inductor. The value of each adjustable spiral inductor may be adjusted by removal of one or more air bridges disposed along the inner turn of the inductor. This permits one to "tune" the amplifier and optimize its performance.

9 Claims, 3 Drawing Sheets

MMIC (MONOLITHIC MICROWAVE INTEGRATED CIRCUIT) LOW NOISE AMPLIFIER

BACKGROUND OF THE INVENTION

1. Field of the Invention

The invention relates to integrated circuits for use at microwave frequencies, and more particularly to MMIC amplifiers in which the adjustability of critical components is used to simplify the design process and manufacturability of amplifiers required to meet performance specifications.

2. Prior Art

The design and manufacture of an electronic amplifier has always been a matter of substantial complexity. That complexity has increased with the advent of integrated circuits operating at microwave frequencies.

The conventional design procedure for electronic equipment, operating at lower than microwave frequencies, for instance an amplifier, involves compartmenting the amplifier into a succession of stages each comprised of active elements and passive elements. The circuit elements of the amplifier circuit will then receive design values. Resistors will be given resistance values in ohms; capacitors, capacitance values in farads; inductors, inductance values in henrys (the active elements are similarily treated), etc. However, in the physical world, all elements, even at lower frequencies, share measurable amounts of all three properties. The secondary properties, which are often not dealt with in the first stage of the paper design, affect performance so that when the components are assembled, a further iteration in the design procedure is required. The iteration in which the realities of the physical design modify the paper design is termed the "bread board" or "brass board" stage.

After the bread board stage, the question of reproducability or manufacturing is raised. At this point it is decided how to specify the components, which components can be treated as fixed, their tolerance and which components may require adjustment in the interests of achieving peak performance.

Most common electronic equipment (radios, TVs, etc.), until the advent of electronic tuning, used tuning in all circuits operating above audio frequencies. Adjustment is ordinarily labor intensive and the reduction of adjustment costs has been the object of much design activity.

The advent of the integrated circuit changed the ground rules, but continued the inherent complexity of the design and fabrication process. At the lower frequencies, electronic equipment has ordinarily been of a hybrid design in which the active components, the resistors, and small capacitors are a part of the integrated circuit, and the components that cannot be fabricated on the substrate or which require tuning adjustments, are fabricated off the chip. The IC thus required the making of the masks, and the actual fabrication of the IC, together with the testing of the completed amplifier, in the bread board stage.

At microwave frequencies, the design and manufacture of the integrated circuit is now further complicated. One cannot "off-board" components without severe performance penalties. One has to fabricate all the active and passive components whether fixed or adjustable on the integrated circuit.

At microwave frequencies, the components are much more variable than on lower frequencies. A length of transmission line, for instance, depending upon frequency, may appear to be a capacitor, or an inductor, or a resistor. Inductors may become capacitors, and capacitors may become inductors. One must model each component of the amplifier in the complex plane in a manner which recognizes this hightened frequency dependence.

The paper design of the MMIC thus requires that the complicated model of each proposed component be entered into the computer before computer simulation is possible. The computer simulation, however, suffers from the inaccuracies of the models of the individual components. In predicting the performance of the aggregate physical realization, the simulation is often far off the mark.

Even after computer simulation, one must test the MMIC paper design in the physical world. This cannot be done without making the masks and making the actual integrated circuit. The procedure is of considerable expense, and every effort is directed to improve the probability that a second design iteration will not be required.

The need has accordingly arisen for MMIC designs that are of greater predictive accuracy when practically realized and in the event of inaccuracy in the practical realization easily adjusted to achieve optimum performance.

SUMMARY OF THE INVENTION

It is an object of the invention to provide an improved amplifier fabricated by integrated circuit techniques for operation at microwave frequencies.

It is a further object of the invention to provide an MMIC amplifier having improved means of adjustment.

It is another object of the invention to provide an MMIC (Monolithic Microwave Integrated Circuit) amplifier in which the design procedure is simplified.

It is still another object of the invention to provide an MMIC amplifier in which the manufacturability is improved.

These and other objects of the invention are achieved in a low noise MMIC amplifier comprising a substrate of GaAs having a signal input, a first and a second transistor amplifier stage and a signal output.

The first transistor stage includes a first transistor having gate, source, and drain electrodes, and a source feedback inductance coupled between the source and substrate ground. A first "input" TEE network is provided which includes a first adjustable spiral inductor, and a second "output" TEE network is provided which includes a second adjustable spiral inductor.

The second transistor stage comprises a second transistor having second gate, source, and drain electrodes, the second source being connected to substrate ground. A third "input" TEE network is provided which includes a third adjustable spiral inductor, and a fourth "output" TEE network is provided which includes a fourth adjustable spiral inductor.

Each such TEE network has a first serial element, a shunt element, and a second serial element. The source feedback inductance is selected to permit optimization in both the input impedance match and the input signal to noise ratio. Further in accordance with the invention, the first adjustable spiral inductor is the shunt element, the second adjustable spiral inductor is the shunt element, the third adjustable spiral inductor in the first serial element, and the fourth adjustable spiral inductor is in the second serial element.

The second and third TEE networks are the electrical equivalents of inductive TEE networks. In the second TEE network the values are selected to tune out the drain capacitance of the first transistor and to provide a downward impedance transformation. In the third TEE network, the values are selected to tune out the gate capacitance of the second transistor and to provide a downward impedance transformation.

When the low noise amplifier is a separate integrated circuit with the signal input and signal output being taken from flying leads attached to pads, the properties of the first and fourth TEE networks are affected. The first TEE network becomes the equivalent of an inductance TEE, in which the values are selected to optimize the input match and signal to noise ratio. In the fourth TEE network, the second serial element becomes capacitive, and the values are selected so that the drain capacitance of the second transistor is tuned out and a downward impedance transformation is provided to match the output load.

The inductance adjustment in the foregoing TEE network is achieved by the use of removable air bridges at the interior of spiral inductors.

DESCRIPTION OF THE DRAWINGS

The inventive and distinctive features of the invention are set forth in the claims of the present application. The invention itself, however, together with further objects and advantages thereof may best be understood by reference to the following description and accompanying drawings in which:

DESCRIPTION OF THE PREFERRED EMBODIMENT

Figure 1:
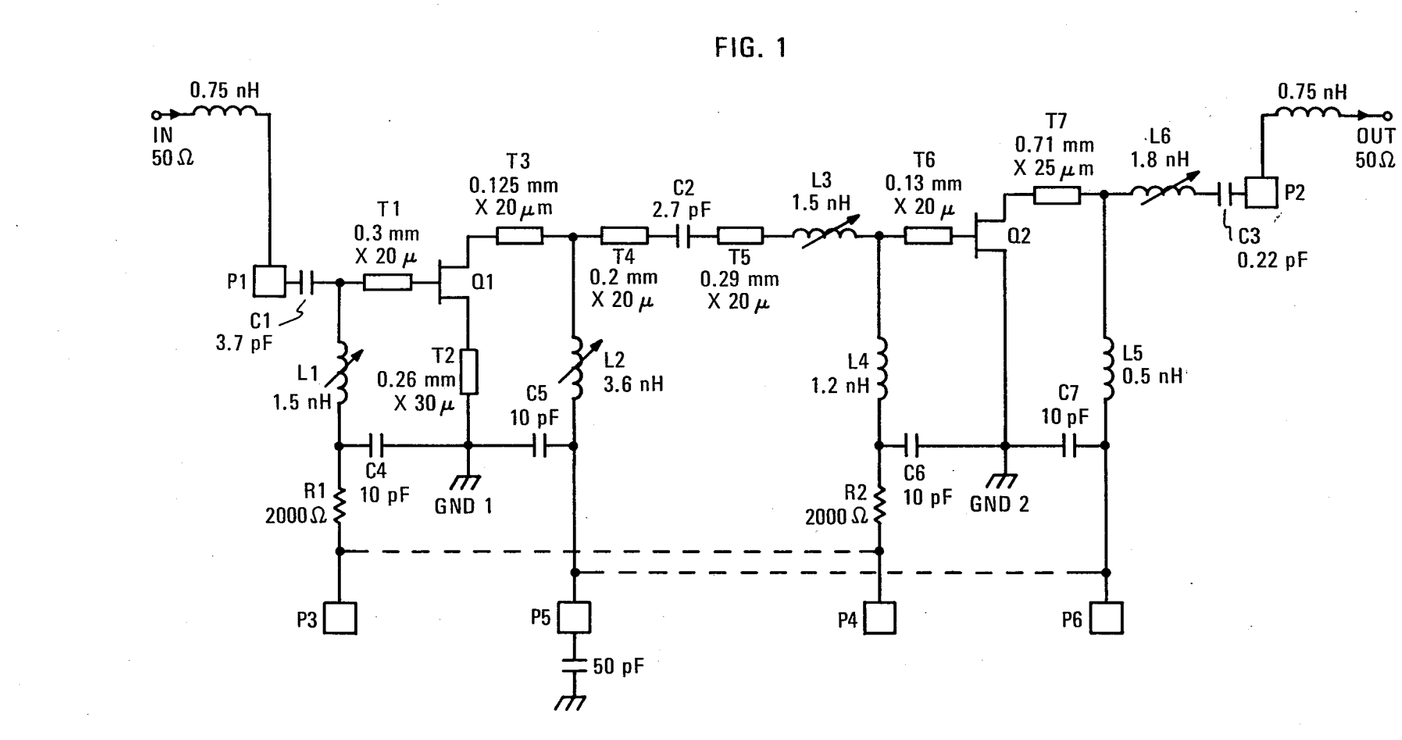
FIG. 1 is an equivalent circuit representation of a compact two-stage low noise amplifier suitable for fabrication using monolithic microwave integrated circuit techniques.

Referring now to FIG. 1, a two-stage low noise amplifier in accordance with the invention is illustrated. The amplifier is compact and reproduction tolerant. It is fabricated using monolithic microwave integrated circuit techniques upon a Gallium Arsenide substrate for use at 5 to 6 GHz. The amplifier is designed to receive a signal from a 50 ohm source via a flying lead coupled to its input pad P1 and to deliver an output signal which is an amplified version of the input signal to the output pad P2 for connection to a 50 ohm load via a flying lead. The circuit is designed to be operated with a +3 volt dc source to drain voltage coupled to the pads P5, P6 and an approximately −1 volt dc gate voltage coupled to the pads P3, P4, both voltages being referenced to the ground plane of the substrate. The circuit requires an area of 2140×990 microns and the substrate is of 5 mil thickness. The amplifier, in a specific example, has a gain of 20 db (S21) and a noise figure of about 2 db operating through the 5 to 6 GHz band. The circuit can be operated with a wide range of drain currents. Optimum performance is obtained in the range of 40 to 80 milliamperes. Maximum gain is achieved when the current drain is 80 milliamperes.

The first stage of the amplifier consists of a first field effect transistor Q1, a feedback impedance (T2) in the connection to the source electrode, and adjustable input and output circuits connected respectively to the gate and drain electrodes. The field effect transistor Q1 is specifically designed for high frequency operation (e.g. 5–6 GHz) and has a 6 finger gate structure, each gate being a half micron in length and 100 microns in width. The source of the transistor Q1 is coupled by the transmission line T2 forming the feedback impedance to substrate ground, the ground connection GND1 being taken through a first perforation of the substrate. The ground connection (GND1) for the source connection is shared by the input and output circuits of the first stage.

The input circuit of the first stage comprises a serial portion including a coupling capacitor C1 and a short length of transmission line T1, and a shunt portion comprising a first adjustable spiral inductor L1, a bypass capacitor C4, and an isolating resistor R1. The coupling capacitor C1, which has a value of 3.7 pf and has one terminal connected to the signal input pad P1 and the second terminal connected via the transmission line T1 to the gate terminal G1 of the transistor Q1. The first adjustable inductor L1 of the shunt portion has a value of of 1.5 nH. One terminal of the adjustable inductor L1 is connected to the second terminal of capacitor C1 and the second terminal of the adjustable inductor is coupled via the isolating resistor R1 of 2000 ohms to the pad P3. The pad P3 is the terminal for application of the gate potential to the first stage. The second terminal of the inductor L1 is also coupled via the bypass capacitor C4 having a value of 10 pf, to the ground connection GND 1.

The output circuit of the first stage comprises a serial portion comprising a pair of transmission lines T3 and T4, and a shunt portion comprising a second adjustable spiral inductor L2 and a bypass capacitor C5. The transmission lines T3 and T4 are serially connected in the order recited between the drain D1 and one terminal of the interstage coupling capacitor C2 of 2.7 picofarads. In the shunt portion of the output circuit, the node between transmission lines is connected to one terminal of the second adjustable spiral inductor L2, the second terminal being bypassed by the capacitor C5 to ground at the ground connection GND1. The second terminal of the second adjustable inductor L2 is also coupled to the pad P5 at which the drain potential for the first stage is applied.

Figure 2:
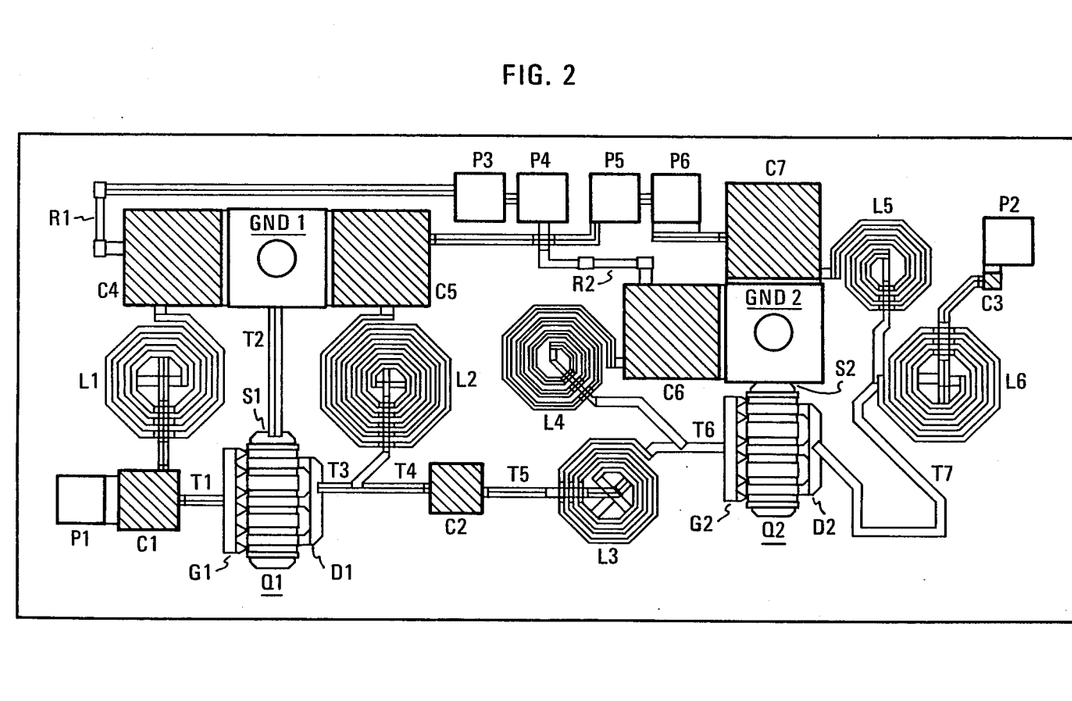
FIG. 2 is a plan view of the layout of the two-stage MMIC amplifier whose circuit design is provided in FIG. 1.

The physical layout is illustrated in FIG. 2. In the layout, the path from the gate G1 via transmission line T1, capacitor C1, Inductor L1, and capacitor C4 to the ground GND1 is short and direct as are the paths from the source S1 via transmission line T2 to the ground GND1 and from the drain D1 via transmission line T3, inductor L2 and Capacitor C5 to the ground GND1. Thus, the first stage has only a single ground connection (GND1) which both makes more efficient use of the chip area in avoiding an additional ground connection for that stage, and which is efficient electrically in facilitating short paths with low parasitic losses to the electrodes of the transistor gain element.

The input and the output circuits of the first stage are coupling networks using inductive elements in TEE networks to provide two successive downward impedance transformations. The presence of a variable inductance element in each coupling network allows for critical adjustment of the input stage in optimizing the match and signal the noise ratio.

The input circuit of the first stage provides the desired match of the signal source to the gate G1, providing the load. The pad P1 is normally coupled to a signal source having 50 ohms impedance with a flying lead. The flying lead has series inductance and is series resonant with the coupling capacitor C1 at a frequency below the operating band. Thus, at operating frequencies, the first serial element of the TEE network is an equivalent series inductance. The shunt member of the TEE network is the variable inductor L1. The last member of the TEE network (and the second series member) is the transmission line T1, also inductive which is coupled to the gate of transistor Q1, forming the load of the TEE network.

The adjustable TEE network at the input of transistor Q1, composed of three equivalent inductors including the variable inductor L1, provides a significant step down in impedance from the input impedance of 50 ohms to the real part of the gate input impedance which is approximately 5 ohms. The input TEE network tunes out the effect of the FET gate capacitance as well as providing this impedance transformation. It is possible to empirically optimize the performance of this network by using the adjustability in inductor L1.

The dominant contribution to the noise which determines the signal to noise performance is that introduced by transistor Q1, which depends on the source impedance for which the transistor provides the load. The source impedance required to obtain the lowest noise figure from a transistor is normally different from the source impedance required to achieve a good power match. These impedances can be made very similar to optimize both criteria over a narrow band, however, by using feedback in series with the source of the FET. This is the function performed by the straight transmission line T2.

In the output circuit of the first stage, there is also a TEE network which tunes out the source drain capacitance of the FET and provides a downward impedance transformation. The output impedance of the drain of transistor Q1, the real part of which is approximately 100 ohms, is transformed by the TEE network to an intermediate value at the interstage coupling capacitor C2. The tuning and impedance transforming properties of this network are adjustable with inductor L2.

The TEE network in the first stage output circuit comprises the transmission line T3 exhibiting an inductance as the first series element, the adjustable inductor L2 as the shunt element, and the transmission line T4 exhibiting an inductance, as the second series element. At the coupling capacitor C2, an impedance intermediate to the high output impedance of Q1 and a low input impedance of a transistor Q2 is reached. The impedance transformation ratio is adjustable to the optimum value by adjusting the value of the adjustable inductor L2.

The second stage of the amplifier consists of a second field effect transistor Q2 operated with its source electrode grounded and includes adjustable input and output circuits connected respectively to the gate and drain electrodes. The field effect transistor Q2 is specifically designed for high frequency operation and is identical to the first field effect transistor Q1. The source of the transistor Q2 is directly connected to a second ground connection GND2 taken through a second perforation of the substrate. The ground connection GND2 is shared with the input and output circuits of the second stage and is the only ground connection required for the second stage.

The input circuit of the second stage comprises a serial portion including the interstage coupling capacitor C2, a length of transmission line T5, a third adjustable spiral inductor L3 and a short length of transmission line T6. The second terminal of the coupling capacitor C2 is serially connected via the transmission line T5, the adjustable inductance L3 and the transmission line T6 to the gate G2 of transistor Q2.

The input circuit of the second state also includes a shunt portion including an inductor L4 (normally not adjustable), a bypass capacitor C6, and an isolating resistor R2. The fixed spiral inductor L4, which has a value of 1.2 nH, has one terminal connected to the node between inductor L3 and transmission line T6, and the second terminal connected to a first terminal of bypass capacitor C6 which has a value of 10 pf. The second terminal of the bypass capacitor C6 is connected to the second ground connection GND2 through the second perforation of the substrate. The node between the inductor L4 and capacitor C6 is connected through the isolating resistor R2 of 2000 ohms to the pad P4 at which the gate potential for the second stage is applied. Normally the pads P3 and P4 are connected by a removable air bridge as shown. The gate potentials applied to Q1 and Q2 are thus the same in this embodiment, but may be made different if the fusable air bridge is removed and separate gate supplies provided.

The output circuit of the second stage comprises a serial portion comprising a transmission line T7, an adjustable spiral inductor L6, and a coupling capacitor C3, and a shunt portion comprising a fixed spiral inductor L5 and a bypass capacitor C7. The transmission line T7, adjustable spiral inductor L6, and the coupling capacitor C3 are serially connected in the order recited between the drain D2 and the signal output pad P2. In the shunt portion of the output circuit, the node between the transmission line T7 and the adjustable inductor L6 is connected to one terminal of a fixed inductor L5 having an inductance of 0.5 nH. The second terminal of the inductor L5 is bypassed to ground by the bypass capacitor C7 having a value of 10 pF. The ground connection is made at the ground connection GND2. The second terminal of the inductor L5 is also coupled to the pad P6 at which the drain potential for the second stage is applied. (The pads P5 and P6 have a removable air bridge connection as shown. The drain potentials applied to both Q1 and Q2 are thus the same in this embodiment, but may be made different if the air bridge is removed and separate drain supplies provided.)

The input and output circuits of the second stage also contain coupling networks using inductive elements in TEE networks to provide two successive impedance transformations and to tune the FET capacitances. The first TEE network in the input circuit of the second stage occurs in the path between the capacitor C2 and the gate G2 of the transistor Q2. The variable element is the adjustable inductor L3 which is contained in the first serial arm of the TEE network. The shunt element of the TEE network is the fixed element L4 and the second serial element of the TEE network is the transmission line T6 acting as an equivalent inductance. The TEE network just described has the function of transforming the impedance at the coupling capacitor C2 down to the approximately 5 ohm real input impedance at the gate G2. It simultaneously tunes out the approximately 0.5 pf of FET gate capacitance.

The output circuit of the second stage also includes a TEE network providing a downward impedance transformation. Here the TEE network consists of the transmission line T7 forming the first serial arm, the fixed inductor L5 forming the shunt element and the adjustable inductor L6 in series with capacitor C3 forming the second serial element. In connection with external circuitry, the inductance of the output flying lead is also a part of the second serial arm. Here the transformation is from the higher impedance (approximately 100 ohms, real part) at the drain D2 of the transistor Q2 to the 50 ohm output impedance. As well as achieving this impedance transformation, the network absorbs the effect of the approximately 0.27 pf of drain capacitance of the FET. The capacitor C3 provides a dc block at the output of the amplifier. Its value is selected so that it series resonates with inductor L6 and the output flying lead just above the design band thus the second serial arm exhibits a capacitive impedance at the design frequency. This provides a good match across the required frequency range. The presence of the adjustable inductance in each coupling network allows for critical adjustment of the output stage for optimum performance.

The illustrated amplifier is designed for use in a phased array antenna system. Each system may require several thousand such amplifiers making both the cost of each amplifier and uniformity of amplifier performance critical. The illustrated amplifier is designed to operate from 5-6 GHz with a low noise figure, good impedance matching (low VSWRs) and a high and flat gain of about 20 dB.

The adjustment of the element parameters and the performance achieved will now be discussed in greater detail. The inductor L1, in particular, affects both the noise figure and the input match. The inductor L1 is adjusted to parallel resonance with gate or input capacitance of the transistor Q1 to achieve a good impedance match at the center of the band. Mathematically, it is desirable that the S11 Parameter be about 10 db or better.

The amplifier, which is designed for a 20% relative bandwidth and on which input matching is critcal, benefited by an improvement in the noise performance of about 0.3 dB by removal of two of the air bridges in the input inductor L1. The final noise figure for the two stage amplifier was about 2 dB.

In the interstage coupling network, adjustment of the inductors L2 and L3 adjusts the impedance match between the transistors Q1 and Q2. Inductor L2 is parallel resonant with the drain or output capacitance of transistor Q1. In conjunction with transmission lines T3 and T4, which appear as inductors, the inductor L2 provides impedance transformation into the input of the second stage. The interstage coupling capacitor C2 isolates the dc potentials between the drain D1 and the gate G2. The capacitor C2 in conjunction with inductors L3 and L4 then matches the gate capacitance associated with the FET Q2 and transforms the real part of the impedance of gate G2 to equal the partially transformed impedance created by L2 in conjunction with T3 and T4. The combined effect of all these elements is to tune out the drain capacitance of Q1 and the gate capacitance of Q2 and to transform the real part of the impedances associated with the drain of Q1 and the gate of Q2 so that they match. This gives optimum power transfer and maximum gain.

The inherent gain of transistors decreases with frequency primarily because of the RC nature of the gate circuits. The roll off is approximately 6 db per octave. In order to achieve flat gain across the band the element values are selected to provide optimum matching at 6 GHz and slightly less than optimum matching at lower frequencies. The tuning available within inductors L2 and L3 may be used to both peak the gain and flatten the gain. In particular increasing the inductance of these components increases the gain of the circuit at 6 GHz while not changing the gain at 5 GHz. However, because of the finite isolation of the FETS, changing these component values slightly, degrades the input and output matches and may call for an additional iteration in the optimization process.

The inductive tee network T7, L5, L6 in combination with the series capacitor C3 forms a filter network which compensates the drain capacitance of FET Q2 and which transforms the real part of the drain resistance to match the 50 ohm output. The adjustment available with the inductor L6 provides a fine tune capability for this impedance matching network.

Figure 3:
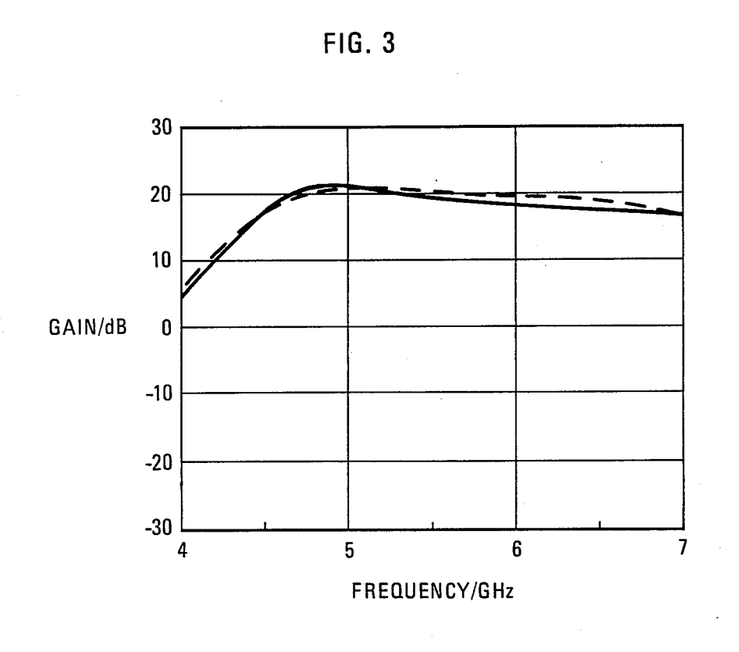
FIG. 3 is a graph of the forward gain (S21) of the amplifier, before and after final adjustment of the inductance to reduce high frequency roll off.

The gain performance of the amplifier before and after adjustment is illustrated in FIG. 3. The solid line depicts the performance before adjustment and the dotted line depicts the performance after adjustment with the inductances L1, L2 and L3 being subjected to adjustment. The effect of the adjustment is to reduce the roll-off approximately in half, and to bring the gain to 20 dB with less than one dB of roll-off.

The air bridges previously referred to are metal connections between two metal tracks on the surface of the Gallium Arsenide substrate which are spaced from the surface of the GaAs allowing an air-filled gap in the intervening space. The air bridges may be of conventional design and may be fabricated using conventional GaAs processing techniques.

Air bridges are used in three different ways in the integrated circuit herein described. One way is in the provision of electrical connections between points in the circuit which can easily be removed during testing. This makes it possible to ascertain quickly the performance of the circuit both with and without the connection present. It is advantageous to use air bridges for removable connections. Air bridges can be and are typically made of thinner metal than the transmission line without significant loss or reduction in reliability, a factor reducing the amount of material which must be severed to break the connection. In addition, the presence of the air gap underneath the air bridge reduces the thermal load to primarily that of the bridge alone when the material is removed by the heat applied by a laser. The air gap also makes it possible to remove the air bridge with minimal damage to the underlying Gallium Arsenide.

Air bridges forming removable connections have been used between the pads P3 and P4, and between P5 and P6 to permit flexibility in biasing the transistors Q1 and Q2 and at the inner ends of the inductors L1, L2, L3 and L6 to facilitate adjustment of the value of the respective inductors.

The second way of using air bridges in the present integrated circuit is in providing an electrical track connecting a first and a second metal track together while crossing over a third metal track without connecting to it. Such air bridges are used in all spiral inductors and multi-fingered FETs.

The third application of air bridges in the present integrated circuit is to connect to the top plate of the capacitors. The capacitors in this circuit consist of a metal bottom plate formed on the upper surface of the GaAs substrate and covered by a dielectric layer. The top plate is then formed on the dielectric layer. Air bridges are necessary to connect from this top plate to the other circuit elements formed on the upper surface of the substrate.

Air bridges are required to make the connection to the upper plates of all capacitors used in the integrated circuit. For instance, the bypass capacitors C4 and C5 have their lower plates connected to the metallization associated with the ground GND1. The connections of the inductor L1 and resistor R1 to the upper plate of capacitor C4 and the connections of the inductor L2 and the pad P5 to the upper plate of capacitor C5 are air bridges. Similarly bypass capacitors C6 and C7 each have two connections using air bridges. In the case of signal coupling capacitors C2 and C3 each have one connection to the underlying plate, and one air bridge connection to the upper plate. Capacitor C1 has 2 connections to the underlying plate and one air bridge connection to the upper plate.

The present circuit which require a circuit size of 2140×990 microns replaces an earlier design which had similar electrical performance but which required a circuit size of 3860×2370 microns. The new circuit is 4.3 times smaller and so represents a design which is approximately 4.3 times less expensive to manufacture.

The size reduction from earlier designs may be attributed to the use of spiral transmission lines to replace linear transmission lines in the inductors employed and to the reduction of the number of grounds to one for each stage of the two stage amplifier.

The size reduction achieved by replacing linear transmission lines by spiral transmission lines performing the role of inductors contributes substantially to the size reduction. To a crude approximation the same transmission line length must be used when the inductive track is layed out linearly as an isolated transmission line as when it is coiled into a spiral. Conventional transmission lines require separations of approximately one substrate thickness (5 mils or 127 microns) to minimize cross-coupling effects with adjacent circuits. In a spiral inductor, the tracks can typically be separated by from 5 to 10 microns, and only the outer conductors of the completed inductor need maintain the 127 micron separation from other circuits. The result of the use of spiral inductors is a substantial reduction in the area allocated to the inductors, and since they form a major part of the input and output circuits, a substantial reduction occurs to the area required for each amplifier stage.

A second source of area reduction is the reduction of grounds from two to one per stage. As can be seen from FIG. 2, the area required by each ground is not insignificant, so reducing the number of grounds from four to two helps reduce the circuit size.

The integrated circuit herein described, in addition to requiring minimum substrate area has easily predicted performance, and readily adapts to manufacturing variations, thus shortening the design cycle and enhancing the yield once manufacturing is underway.

The foregoing descriptions of the role of the input and output networks is in some degree simplified from the actual computer optimization which deals comprehensively with the variables and by prediction allows one to maximize more than a single variable. The computer program correctly accounts for the interaction of all the impedances within the circuit including both the resistive and the reactive elements. The accuracy of the computer projections is, however, premised on the accuracy of the models of the electrical elements of the circuit, which at microwave frequencies are relatively inaccurate. There is accordingly, a need for the design to contain allowances at the critical elements for easy readjustment in the element value at a point in the procedure not requiring a large expense.

The present integrated circuit is thus made in the context of imperfect and inaccurate design data for electrical components operating in the microwave frequency spectrum. The saving of a design iteration may in many cases represents a saving in both time and dollars of a very substantial amount. Any enhancement of the yield is a gain in profit substantially without incremental cost.

Inaccuracies in design data as they apply to transmission line inductors may be further particularized. In order to be able to accurately design with transmission lines, they must be separated by approximately one substrate thickness (5 mils) to minimize cross-coupling effects, the design approaching maximum accuracy with "infinite" separations and relatively long straight tracks.

The analytic tools for predicting electrical performance of spiral inductors are of even lower accuracy than those for straight transmission lines. They are premised on smoothly curved spirals, which are realized in practice by a succession of straight lines recurrently turned inwardly 45 degrees to form eight sided turns, the sides and the turns increasing as one proceeds outwardly around the inductor.

Thus, granted that the use of spiral inductors could save substantial substrate area, any saving could easily be offset by additional design iterations, or lower yields of acceptable integrated circuits. Air bridged terminal connections, as employed in the inductors L1, L2, L3 and L6 and as illustrated in FIG. 2, provide the means to fine tune the inductance structures as a final stage in the fabrication of the integrated circuit to achieve the desired circuit values and the required amplifier performance.

The air bridges thus minimize the uncertainty of the inductance parameters in the design and reduce the number of design cycles and thereby the cost of the design. In some applications it may be cost effective to use the air bridges to compensate for the variations in the product parameters of such devices as the ½ micron transistors requiring ½ micron features.

The manner of adjusting the inductance of each inductor is by use of up to four connections between the innermost turn of the inductor and a straight conductor passing from the center to the outside of the inductor. The emergent end of the straight conductor forms one inductor terminal and the outer end of the winding forms the second inductor terminal. The connection made at the end of the inner turn of the spiral conductor and the inner end of the straight conductor may be an air bridge or a permanent connection. The straight conductor exits the center of the inductor by an insulated passage under a succession of air bridged turns.

The remaining (up to three) connections spaced along the inner turn of the inductor are air bridges whose presence shortens the length of the inductor in proportion to the amount of the inner turn which they shunt. The removal of successive air bridges starting with the bridge furthest from the final connection produces a stepped increase in inductance comparable to the contribution of the fraction of a turn added. The removal provides added flexibility to compensate for design and fabrication uncertainties.

Economics in the cost of the IC may determine how the adjustability feature is implemented. Since each IC already requires a number of air bridges, the cost of any additional air bridges needed for adjustment of the inductances is negligible. However the cost of removal of an air bridge, on one IC at one time, for a quantity of ICs may exceed the cost of deleting the air bridge from the masks and processing additional ICs. Small mask changes are inexpensive in relation to larger changes in the mask, which may be of prohibitive expense. To make a design having the greatest probability of success, one should target the adjustment range of the initial layout upon the middle of the optimum electrical value. Thus it would be most probable that half of the adjusting range would be utilized and in designs having two air bridges, at least one air bridge would be retained in the adjusted final design, after the unwanted air bridge had been removed.

The layout of the inductor to achieve the desired adjustability should ordinarily reserve a large central area relative to the total size of the inductor, so that the inner turn will be large enough to exhibit a significant portion of the total inductance of the inductor. In addition, the central opening must ordinarily be dimensioned to accommodate, radially arranged air bridges, each originating from the center and terminating on the inner most turn of the inductor. The radial arrangement, normally permits at least four air bridges at each of the eight possible positions in a process allowing 45° lines.

The air bridge will ordinarily have a width of 10 to 20 microns with typical minimum lengths of 25 microns for easy removal by a laser. Accommodating the need for laser removal sets a minimum diameter for the open area of about 60 to 80 microns. Laser removal requirements also tends to limit the upper number of air bridges to four in the interest of allowing adequate space between bridges to avoid interference with the bridge not being removed. The open area may be larger than the minimum set to accommodate the air bridges in favor of increasing the adjustment range.

The two stage amplifier herein treated has four inductive TEE networks, each with an adjustable element for providing optimum amplifier performance. The feedback provided by the fixed inductance of transmission line T2 in the source of the first transistor allows one to match the signal source to the input stage for both a good VSWR and low noise as the variable inductance L1 is adjusted in the first TEE network. The two TEE networks in the interstage coupling network, each having a variable inductance, provide convenient paths to separate source and gate potentials of the two amplifier transistors, span the large impedance differences and provide two added degrees of flexibility. The fourth TEE network in the second stage provides a fourth degree of flexibility.

A high performance MMIC amplifier is provided that is easy to apply to comparable microwave frequency applications, requires fewer iterations in the design process, and when costs permit, should manufacturing tolerances conspire to reduce performance, is readily readjusted at minimum cost to optimum performance.

What is claimed is:

1. A MMIC (Monolithic Microwave Integrated Circuit) low noise amplifier comprising:

(A) a substrate of GaAs having a substrate ground on the under surface thereof, a signal input and a signal output on the upper surface thereof, (B) a first transistor amplifier stage comprising
  (1) a first transistor formed on the upper surface of said substrate, and having first gate, source, and drain electrodes, a source feedback inductance coupled between said source and substrate ground,
  (2) a first TEE network having a first terminal coupled to said signal input, a second terminal coupled to said first gate and a third terminal coupled to substrate ground and including a first adjustable spiral inductor, and
  (3) a second TEE network having one terminal connected to said first drain, and a second terminal coupled to a first stage output terminal, and a third terminal coupled to substrate ground, and including a second adjustable spiral inductor, and (C) a second transistor amplifier stage comprising
  (1) a second transistor formed on the upper surface of said substrate, and having second gate, source, and drain electrodes, the second source being connected to substrate ground,
  (2) a third TEE network having a first terminal coupled to said first stage output terminal, a second terminal coupled to said second gate and a third terminal coupled to substrate ground and including a third adjustable spiral inductor, and
  (3) a fourth TEE network having a first terminal connected to said second drain, a second terminal coupled to said signal output, and a third terminal coupled to substrate ground, and including a fourth adjustable spiral inductor, said source feedback inductance being selected to permit optimization in both the input impedance match and the input signal to noise ratio.

2. The low noise amplifier set forth in claim 1 wherein each TEE network has a first serial element, a shunt element, and a second serial element, and wherein
  said first adjustable spiral inductor is included in the shunt element in said first TEE network,
  said second adjustable spiral inductor is included in the shunt element in said second TEE network,
  said third adjustable spiral inductor is included in the first serial element in said third TEE network, and
  said fourth adjustable spiral inductor is included in the second serial element in said fourth TEE network.

3. The low noise amplifier set forth in claim 2 wherein said second and third TEE networks are the electrical equivalents of inductive TEE networks,
  in said second TEE network; said first serial element includes a short transmission line exhibiting an inductive impedance at the operating frequency, said shunt element includes a bypass capacitor coupling said second adjustable spiral inductor to substrate ground, and said second serial element includes a short transmission line exhibiting an inductive impedance at the operating frequency,
  in said third TEE network; said first serial element includes a coupling capacitor and a short length of transmission line coupled to said third adjustable spiral inductor, the three exhibiting an inductive impedance at the operating frequency, said shunt element includes a spiral inductor exhibiting an inductive impedance at the operating frequency and a bypass capacitor capacitively coupling said inductor to substrate ground, and said second serial element includes a short transmission line exhibiting an inductive impedance at the operating frequency.

4. The low noise amplifier set forth in claim 3 wherein
the inductance values of said second TEE network are selected to tune out the drain capacitance of said first transistor and to provide a downward impedance transformation, and
the inductance values of said third TEE network are selected to tune out the gate capacitance of said second transistor and to provide a downward impedance transformation.

5. The low noise amplifier set forth in claim 3 wherein
said low noise amplifier is a separate integrated circuit, said signal input and signal output being pads on the upper surface of said substrate to which flying leads may be attached,
said first TEE network becomes the equivalent of an inductance TEE when said amplifier is connected by a flying lead to a source, the first serial element including the flying lead and a coupling capacitor, the pair exhibiting an inductive impedance at the operating frequency, said shunt element includes a bypass capacitor coupling said first adjustable spiral inductor to substrate ground and the second serial element including a short transmission line exhibiting an inductive impedance at the operating frequency, and
in said fourth TEE network; said first serial element includes a short transmission line exhibiting an inductive impedance at the operating frequency, said shunt element includes a spiral inductor and a bypass capacitor coupling said spiral inductor to substrate ground, and
said second serial element includes a coupling capacitor coupling said fourth adjustable spiral inductor to said output pad, and a flying lead coupled to a load.

6. The low noise amplifier set forth in claim 5 wherein
the values of the inductances of said first TEE network are selected in conjunction with the feedback inductance to permit optimization of the input match and signal to noise ratio, and
the values of the inductances and capacity of said fourth TEE network are selected so that the source drain capacitance of said second transistor is tuned out and a downward impedance transformation to match the output load is permitted.

7. The low noise amplifier set forth in claim 1 wherein
each of said adjustable inductors has a first terminal connected to the end of an outer turn of the inductor and a second terminal connected to a conductor passing from the outside to the center of said inductor, the inner end thereof having a first connection to the end of an inner turn of the inductor, and at least one additional, removal connection to a second position along said inner turn, removal providing said adjustment.

8. The low noise amplifier set forth in claim 7 wherein
said removable connections are air bridges, dimensioned for easy removal.

9. The low noise amplifier set forth in claim 1 wherein
said first and second TEE networks and said source feedback inductance are coupled to substrate ground via a first perforation, and
said third and fourth TEE networks and said second source are coupled to substrate ground via a second perforation.

* * * * *